United States Patent
Siddiqui et al.

(10) Patent No.: US 6,893,476 B2
(45) Date of Patent: May 17, 2005

(54) COMPOSITION AND ASSOCIATED METHODS FOR CHEMICAL MECHANICAL PLANARIZATION HAVING HIGH SELECTIVITY FOR METAL REMOVAL

(75) Inventors: Junaid Ahmed Siddiqui, Richmond, VA (US); Timothy Frederick Compton, Casa Grande, AZ (US)

(73) Assignee: DuPont Air Products Nanomaterials LLC, Tempe, AZ (US)

(*) Notice: Subject to any disclaimer, the term of this patent is extended or adjusted under 35 U.S.C. 154(b) by 210 days.

(21) Appl. No.: 10/315,398

(22) Filed: Dec. 9, 2002

(65) Prior Publication Data

US 2004/0107650 A1 Jun. 10, 2004

(51) Int. Cl.$^7$ .............................. C09G 1/02; C09G 1/04
(52) U.S. Cl. .............................. 51/307; 51/308; 51/309; 51/298; 106/3; 106/11
(58) Field of Search .................... 51/307, 308, 309, 51/298; 106/3

(56) References Cited

U.S. PATENT DOCUMENTS

| | | | |
|---|---|---|---|
| 3,525,600 A | 8/1970 | Yoshikawa et al. ............ 51/295 |
| 5,397,741 A | 3/1995 | O'Connor et al. | |
| 5,527,423 A | 6/1996 | Neville et al. ............ 156/636.1 |
| 5,614,313 A | 3/1997 | Mills et al. .................. 428/327 |
| 5,626,959 A | 5/1997 | Mills et al. .................. 428/331 |
| 5,650,543 A | 7/1997 | Medina ...................... 568/616 |
| 6,060,156 A | 5/2000 | Chappell, Jr. et al. ...... 428/323 |
| 6,063,306 A | 5/2000 | Kaufman et al. ........... 252/79.4 |
| 6,309,560 B1 | 10/2001 | Kaufman et al. ........... 252/79.1 |
| 6,527,818 B2 * | 3/2003 | Hattori et al. ................ 51/308 |
| 6,579,153 B2 * | 6/2003 | Uchikura et al. ............. 451/41 |
| 2002/0009564 A1 | 1/2002 | Hall et al. .................. 428/35.7 |

FOREIGN PATENT DOCUMENTS

| | | | |
|---|---|---|---|
| JP | 5363691 | 6/1978 | ............ C09G/1/02 |
| JP | 9324174 | 12/1997 | ............ C09K/3/14 |
| JP | 1180671 | 3/1999 | ............ C09G/1/00 |
| JP | 2974988 | 11/1999 | ............ C09G/1/00 |
| JP | 240848 | 9/2002 | ............ C09K/3/14 |
| WO | 9633841 | 10/1996 | ............ B24D/3/28 |
| WO | 9933910 | 7/1999 | ............ C08K/3/36 |
| WO | 0104226 | 1/2001 | |

OTHER PUBLICATIONS

"Surfynol® Additives Reference Guide," Product Bulletin, (1999), Air Products and Chemicals, Inc., no month.
"Effect of Surfactant on CMP Slurry Performance," S. Sundaram, et al, CMC Confernece, Mar., 2001.
"Role of Surfactants on CMP Slurry Performance," J.A. Siddiqui, et al, CMC Conference, Jun. 2002.
"Surfactant Interaction with Cu CMP Slurries," S. Sundaram, et al, VMIC Conference, Sep., 2001.
"Silicone Resin Fine Particle TOSPEARL," Product Bulletin, Toshiba Silicone Co., Tokyo, Japan, no date.
"Tospearl: Silicone Resin for Industrial Applications," R.J. Perry, et al, Amer. Chem. Soc., pp 533–543, 2000, no month.
McCutheon's Vol. 1: Emulsifiers & Detergents, 1999, N. American Ed., p. 196, no month.

* cited by examiner

Primary Examiner—Michael A. Marcheschi
(74) Attorney, Agent, or Firm—Geoffrey L. Chase

(57) ABSTRACT

A composition and associated methods for chemical mechanical planarization (or other polishing) are described. The composition may comprise an abrasive and a dispersed hybrid organic/inorganic particle. The composition may further comprise an alkyne compound. Two different methods for chemical mechanical planarization are disclosed. In one method (Method A), the CMP slurry composition employed in the method comprises comprise an abrasive and a dispersed hybrid organic/inorganic particle. In another method (Method B), the CMP slurry composition employed in the method comprises comprise an abrasive and an alkyne compound. The composition may further comprise an oxidizing agent in which case the composition is particularly useful in conjunction with the associated methods (A and B) for metal CMP applications (e.g., tungsten CMP).

16 Claims, No Drawings

COMPOSITION AND ASSOCIATED METHODS FOR CHEMICAL MECHANICAL PLANARIZATION HAVING HIGH SELECTIVITY FOR METAL REMOVAL

BACKGROUND OF THE INVENTION

The present invention pertains to a composition and associated methods that are useful for chemical mechanical planarization (chemical mechanical polishing, CMP) and which afford high selectivity for removal of metal in relation to dielectric material during CMP processing of substrates comprised of metal and dielectric material.

Chemical mechanical planarization (chemical mechanical polishing, CMP) is now widely known to those skilled in the art and has been described in numerous patents and open literature publications. Some introductory references on CMP are as follows: "Polishing Surfaces for Integrated Circuits", by B. L Mueller and J. S. Steckenrider, Chemtech, February, 1998, pages 38–46; and H. Landis et al., Thin Solids Films, 220 (1992), page 1.

In a typical CMP process, a substrate (e.g., a wafer) is placed in contact with a rotating polishing pad of a table-mounted polisher, which also has a rotating platen onto which the substrate is mounted. A (carrier) platen applies pressure against the backside of the substrate. During the polishing process, the pad and the platen of the table are rotated while a downward force is maintained against the substrate back. An abrasive and chemically reactive mixture, commonly referred to as a slurry, is applied to the pad during CMP processing. The slurry initiates the planarization (polishing) process by chemically reacting with the film being planarized. The CMP process is facilitated by the rotational movement of the pad relative to the substrate as slurry is being provided directly to the substrate/pad interface. Polishing is continued in this manner until the desired film on the substrate is removed with the usual objective being to effectively planarize the substrate (both metallic and dielectric portions).

CMP processing is often employed in semiconductor manufacturing to remove excess metal at different stages. For example, in one semiconductor manufacturing process, metallized vias or contacts are formed by a blanket metal deposition followed by a chemical mechanical planarization (CMP) step. In a typical process, via holes are etched through an interlevel dielectric (ILD) to interconnection lines or to a semiconductor substrate. Next, a thin adhesion layer such as tantalum nitride and/or tantalum is often formed over the ILD and is directed into the etched via hole. Then, a metal film is blanket deposited over the adhesion layer and into the via hole. Deposition is continued until the via hole is filled with the blanket deposited metal. Finally, the excess metal is removed by CMP processing to form metal vias that have been planarized.

Typically metal CMP slurries contain an abrasive material, such as silica or alumina, suspended in an oxidizing, aqueous medium. In metal CMP processing, it is usually important that the removal rate of metal be significantly higher than the removal rate for dielectric material in order to avoid or minimize defects (such as dishing or erosion).

The use of silicone resin particles as fillers in polymeric films to tailor properties of the films is disclosed in various patent references, such as U.S. Pat. No. 5,626,959; U.S. Pat. No. 5,614,313; U.S. Pat. No. 6,060,156; WO 99/33910; and US 2002/10009564. Inclusion of these resin particles in polymeric films can modify/tailor the properties of the film in desirable manners, such as lowering haze level; affording speckle-free films, etc.

A CMP composition containing silane-modified abrasive particles is disclosed in WO 01/04226 and is reported to afford reduction of oxide (dielectric) loss during CMP processing.

A cleaning and polishing agent composition containing phenyl-modified silicone is disclosed in JP 11080671 A and JP 2974988 B2 and is reported to be particularly useful in cleaning and polishing hard surfaces.

An abrasive suitable for polishing a layer of insulating film is disclosed in JP 09324174 A. This abrasive contains composite particles containing organic polymer and polysiloxane chemically bonded with at least one silicon atom of the polysiloxane being bonded with carbon of the polymer. The polysiloxane component contains at least 25 weight percent of silica. The disclosed compositions also can contain a dispersion medium of water and/or alcohol.

A polishing grit and chemomechanical polishing slurry are disclosed in JP2001240848 A. The polishing grit has a polysiloxane coating of a given abrasive particle and is used in a CMP slurry.

A polishing composition for metals is disclosed in JP 53063691 and contains as components alumina particles and silicone polymer.

An abrasive article having a bond system comprising a polysiloxane is disclosed in WO 96/33841 in which the article comprises abrasive particles and a bond system of a binder and a polysiloxane. The article is stated to possess good abrasive efficiency.

An abrasive composition suitable for use in manufacture of abrasive tools is disclosed in U.S. Pat. No. 3,525,600. The composition contains abrasive grains coated with a ceramic and a silicone resin.

Ethoxylated acetylenic glycols having low surface tension and which are suitable as surfactants in aqueous coating systems are disclosed in U.S. Pat. No. 5,650,543.

A polishing composition for use in polishing a hard disk substrate is disclosed in JP97168966A. This composition contains an abrasive and an acetylenic diol defoamer.

CMP slurries that optionally can contain various surfactants are disclosed in U.S. Pat. Nos. 6,309,560 B1; 6,063,306; and 5,527,423.

While the above compositions are useful in various respects, these compositions (and their associated methods) are not suitable for use in CMP of a substrate comprised of a metal and a dielectric material to afford a high selectivity for removal of metal in relation to dielectric during CMP processing. Having high selectivity for metal removal during metal CMP processing is important to prevent dishing and other processing defects. There is a need for compositions (and associated methods) that provide high selectivity for metal removal during CMP. The present invention provides a solution to this significant need.

BRIEF SUMMARY OF THE INVENTION

The invention in one embodiment is a polishing composition comprising:

an abrasive; and a hybrid organic/inorganic particle, wherein the hybrid organic/inorganic particle is neither covalently bonded to nor coated on the abrasive. In another embodiment, the invention is the above polishing composition that further comprises an alkyne compound having at least one hydroxyl substituent.

In yet another embodiment, the invention is a method (Method A) for chemical mechanical planarization of a substrate comprised of metal and dielectric material, the method comprising the steps of:

A) providing a substrate comprised of metal and dielectric material in contact with a polishing pad;

B) providing a composition for chemical mechanical planarization comprising a) an abrasive; b) a component selected from the group consisting of an acid and an oxidizing agent; and c) a hybrid organic/inorganic particle, wherein the hybrid organic/inorganic particle is neither covalently bonded to nor coated on the abrasive, to the substrate; and C) polishing the substrate with the composition to effect at least partial planarization of the substrate, wherein the selectivity for removal of metal relative to dielectric from said substrate is at least 10:1.

In still another embodiment, the invention is a method (Method B) for chemical mechanical planarization of a substrate comprised of metal and dielectric material, the method comprising the steps of:

A) providing a substrate comprised of metal and dielectric material in contact with a polishing pad;

B) providing a composition for chemical mechanical planarization comprising a) an abrasive and b) a component selected from the group consisting of an acid and an oxidizing agent; and c) an alkyne compound having at least one hydroxyl substituent, to the substrate; and C) polishing the substrate with the composition to effect at least partial planarization of the substrate, wherein the selectivity for removal of metal relative to dielectric from said substrate is at least 10:1.

DETAILED DESCRIPTION OF THE INVENTION

This invention provides a composition and an associated method that is useful for chemical mechanical planarization (chemical mechanical polishing, CMP) and which affords high selectivity for removal of metal in relation to dielectric material during CMP processing of substrates comprised of metal and dielectric material in fabricating semiconductor chips/devices.

In one embodiment, the invention is a polishing composition comprising an abrasive and a hybrid organic/inorganic particle dispersed in an aqueous medium.

Suitable abrasives include, but are not limited to, colloidal silica, colloidal ceria, and colloidal titania and surface-modified (e.g., aluminum acetate surface-modified) colloids of these abrasives. Colloidal silica is preferred and a metal salt surface-modified colloidal silica is more preferred. A particularly preferred metal salt surface-modified colloidal silica is aluminum acetate surface-modified colloidal silica.

In this invention, the hybrid organic/inorganic particle can be any particle that is partially organic and partially inorganic as long as the particle is dispersible in an aqueous medium and is neither covalently bonded to nor coated on the aforementioned abrasive (as discussed supra). A suitable hybrid organic/inorganic particle in this invention is a silicone particle. A preferred silicone particle is one comprising a three-dimensional polymer chain of the formula:

in which x is a positive number greater than or equal to 1 and R is an organic group. Preferably, x of the formula is a positive number from 1 to 1.9. Preferably, R of the formula is a hydrocarbon group having one to eight carbon atoms; more preferably, R of the formula is a hydrocarbon group having one to four carbon atoms, and still more preferably R is a methyl group. More preferably, the silicone particle is a polysilsesquioxane having an oxygen to silicon ratio of about 1.5, such as Tospearl® (Toshiba Silicone Co., Ltd., Tokyo, Japan).

A spherical or approximately spherical particle is preferred in this invention. Suitable particle diameters range from about 0.1 micron to about 2 microns, preferably are in the range from 0.2 micron to 1.5 microns, and still more preferably are in the range from 0.3 to 0.7 micron. A particle size less than about 0.1 micron is disadvantageous because the oxide removal rate is high, resulting in poor (low) metal to oxide selectivity. A particle size greater than about 2 microns is disadvantageous because the particles settle rapidly, and deteriorate the uniformity of metal removal rates.

In this invention, the organic/inorganic particle is physically independent of the abrasive. Illustrative, non-limiting examples of a particle that is physically independent of the abrasive includes cases where the particle is neither covalently bonded to nor coated on the abrasive.

In some embodiments useful for metal CMP to enhance the removal rate of metal, the polishing composition not only comprises an abrasive and a hybrid organic/inorganic particle but also further comprises an oxidizing agent. Suitable oxidizing agents include, but are not limited to, periodic acid, hydrogen peroxide, and sodium iodate. Periodic acid is a preferred oxidizing agent, especially for embodiments useful for metal CMP, because this particular component not only provides oxidizing capability but also provides needed acidity for enhanced removal rates of metal in metal CMP processing.

In some embodiments of this invention, the polishing composition not only comprises an abrasive and a hybrid organic/inorganic particle dispersed in an aqueous medium, but also comprises an alkyne compound having at least one hydroxyl substituent. As shown in the examples, there is a synergistic effect between the hybrid organic/inorganic particle and the alkyne compound in further increasing selectivity for metal removal in relation to dielectric above that for which either additive alone exhibits. Consequently, compositions of choice for metal CMP applications where high selectivity for metal removal is desired likely will have both of these components present.

preferred alkyne compound for the composition of this invention preferably has at least two hydroxyl substituents. A suitable alkyne for use in this invention has at least one alkyne (—C≢C—) functionality but may have more than one. A suitable alkyne is a $C_4$–$C_{22}$ alkyne, and a preferred alkyne is a $C_{12}$–$C_{16}$ alkyne. A particularly preferred alkyne compound is 2,4,7,9-tetramethyl-5-decyn-4,7-diol. When an alkyne having fewer than 4 carbon atoms is in the composition, it is disadvantageous because it is a poor nucleophile, and consequently the effectiveness of oxide protection is reduced. When an alkyne having greater than about 22 carbon atoms is chosen, it is disadvantageous because its very low (poor) solubility prevents its use in water-based CMP slurries.

The pH of the composition of this invention is not limited and can be chosen to be that corresponding to an acidic, a basic, or a neutral value. In some embodiments designed for metal CMP applications, it is desirable to have an acidic pH for efficient metal removal during CMP processing. In this case, the pH can range from about 1 to about 6, and preferably be in the range of 2 to 4.

The associated methods of this invention entail use of the aforementioned composition (as disclosed supra) for chemical mechanical planarization of substrates comprised of metal and dielectric material. In the methods, a substrate (e.g., a wafer) is placed face-down on a polishing pad which is fixedly attached to a rotatable table of a polisher. In this manner, the substrate to be polished is placed in direct contact with the polishing pad. A carrier is used to hold the substrate in place and to apply a downward pressure against the backside of the substrate during CMP processing while the table and the pad are rotated. The polishing composition (slurry) is applied (usually continuously) on the pad during CMP processing to effect the removal of material to planarize the substrate.

The composition and associated methods of this invention are effective for chemical mechanical polishing of a wide variety of substrates, including substrates having dielectric portions that comprise materials having low dielectric constants (low K materials). Suitable low K materials in substrates include, but are not limited to, organic polymer (silk flare), carbon-doped oxide (Coral, black diamond), fluorinated silicates, and MesoElk, XLK. Representative K-values and deposition methods for these materials are summarized below.

| Material | K-Value | Deposition Method | Trade Name | Vendor |
|---|---|---|---|---|
| Organic Polymer | 2.3–3.0 | Spin on | Silk ® | Dow Corning |
| C-doped TEOS | 2.5–2.9 | PECVD | Black diamond | AMAT |
| F-doped silica | 3.4–3.8 | Spin on | Nanoglass ® | Honeywell |
| Hybrid-organic/silica | 2.5–2.8 | CVD/Spin on | MesoElk ® | Schmacher |

PECVD = Plasma enhanced chemical vapor deposition
CVD = chemical vapor deposition Similarly, the composition and associated methods of this invention are effective for chemical mechanical polishing of substrates comprised of various metals, including, but not limited to, tungsten and copper. The composition and associated methods of this invention are particularly useful and preferred for tungsten CMP and afford very high selectivities for removal of tungsten in relation to dielectric (as illustrated in the examples).

While not being bound by any particular theory, the inventor believes that the following considerations may explain why a polishing composition comprising a hybrid organic/inorganic particle (e.g., Tospearl®, Toshiba Silicone Co., Ltd., Tokyo, Japan)) is very effective in metal CMP with there being high selectivity for metal removal in relation to dielectric removal. Since particles of this type, i.e., a Tospearl®, particle, has an organic outer surface, it is a relatively soft particle and does not lead to scratching during polishing. The presence of such a soft hybrid organic/inorganic particle in the composition is believed to reduce the coefficient of friction between the substrate and the polishing pad. This reduction in friction level is believed to result in a reduction of removal rate of dielectric material (such as PETEOS) while not substantially changing the removal rate of metal (such as tungsten). Consequently, the presence of such a soft hybrid organic/inorganic particle in the composition significantly raises the metal to dielectric selectivity (e.g., W:PETEOS selectivity).

Again while not being bound by any particular theory, the inventor believes that the following considerations may explain why a polishing composition comprising an acetylenic alcohol (alkyne compound having at least one hydroxyl substituent) is very effective in metal CMP with there being high selectivity for metal removal in relation to dielectric removal. In order to achieve high removal rates of metal in CMP processing, tungsten (or other metal) CMP is preferably carried out in an acidic medium. Under acidic slurry conditions, an (initially) unprotonated dielectric layer (e.g., PETEOS) of a substrate exists in an equilibrium with the protonated form of the dielectric layer. This equilibrium by virtue of the protonated form promotes electrostatic attraction between nucleophilic acetylenic alcohol and the protonated form of the dielectric layer. As acetylenic alcohol (e.g., acetylenic diol) molecules gets attracted to the protonated dielectric surface, this results in at least partial surface coverage of the dielectric, which provides a barrier layer or partial barrier layer of material to protect the dielectric layer during CMP processing. The net result is reduction in oxide removal rates without significant reduction in tungsten (or other metal) removal rates during CMP processing, which consequently enhances the tungsten (or other metal) to dielectric selectivity. In contrast to Tospearl®, the acetylenic alcohol is believed to work primarily on the basis of chemical electrostatic forces during CMP processing.

Taken together, inclusion of both a hybrid organic/inorganic material (e.g., Tospearl®) and an acetylenic alcohol in a composition according to this invention provides a synergistic combination in enhancing W to dielectric selectivity (e.g., W:PETEOS selectivity) during CMP processing.

In this invention, W:PETEOS selectivity (or W:other dielectric) selectivity is at least 10:1, preferably is at least 15:1, and more preferably is at least 30:1.

Glossary
Å: angstrom(s)—a unit of length
BP: back pressure, in psi (pounds per square inch) units
CMP: chemical mechanical planarization=chemical mechanical polishing
CS : carrier speed
DF: Down force: pressure applied during chemical mechanical planarization, units psi
min: minute(s)
nil: milliliter(s)
mV: millivolt(s)
PETEOS: plasma enhanced deposition of tetraethoxy silane, dielectric oxide layer.
psi: pounds per square inch
PAD IC-1400: polishing pad used during chemical mechanical planarization, supplied by Rodel, Inc, Phoenix, Ariz.
PS: platen rotational speed of polishing tool, in rpm (revolution(s) per minute)
SF: slurry flow, ml/min
Silicone: (organosiloxane)
Any of a large group of siloxane polymers based on a structure consisting of alternate silicon and oxygen atoms with various organic radicals attached to the silicon. Discovered by Kipping in England in 1900. Properties: Liquids, semisolids, or solids depending on molecular weight and degree of polymerization. Viscosity ranges from less than 1 to more than 1 million centistokes. Polymers may be straight chain, or cross-linked with benzoyl peroxide or other free radical initiator, with or without catalyst. Stable over temperature range from −50 to +250° C. Very low surface tension; extreme water repellency; high lubricity; excellent dielectric properties; resistant to oxidation, weathering, and high temperatures; permeable to gases. Soluble in most organic solvents; unhalogenated types are combustible. (Taken from Hawley's Condensed Chemical Dictionary, 14th Print Edition, Vol. 1, John Wiley & Sons, Inc., published September, 2001; ISBN: 0471387355.)

Siloxane: (Oxosilane)

A straight-chain compound (analogous to paraffin hydrocarbons) consisting of silicon atoms single-bonded to oxygen and so arranged that each silicon atom is linked with four oxygen atoms. In some types, hydrogen may replace two or more of the oxygens. Disiloxane and trisiloxane are examples. See silicone. (Taken from Hawley's Condensed Chemical Dictionary, 14th Print Edition, Vol. 1, John Wiley & Sons, Inc., published September, 2001; ISBN: 0471387355.)

Surfynol® 104E—This commercial product is 2,4,7,9-tetramethyl-5-decyn-4,7-diol in ethylene glycol in a 50:50 mixture, Air Products and Chemicals, Allentown, PA.

(This 50:50 mixture is easy to handle during the preparation of CMP slurry formulations; hence, Surfynol® 104E was chosen over Surfynol® 104 for use in making the compositions used in the examples.)

Surfynol® 104—This commercial product is 2,4,7,9-tetramethyl-5-decyn-4,7-diol, Air Products and Chemicals, Allentown, Pa.

Tungsten RR: the amount of tungsten removed (units:Angstrons/minute)during chemical mechanical planarization experiments.

Titanium RR: the amount of titanium removed (units:Angstrons/minute) during chemical mechanical planarization experiments.

W: PETEOS Selectivity: the ratio of the amount of tungsten removed to the amount of PETEOS removed during chemical mechanical planarization experiments under identical conditions.

W:Ti Selectivity: the ratio of the amount of tungsten removed to the amount of titanium removed during chemical mechanical planarization experiments under identical conditions.

EXAMPLES

Chemical Mechanical Planarization (CMP) Methodology

In the examples presented below, chemical mechanical planarization (CMP) experiments were run using the procedures and experimental conditions given below.

Metrology

PETEOS thickness was measured with a Nanometrics, model, # 9200, manufactured by Nanometrics Inc, 1550 Buckeye, Milpitas, Calif. 95035-7418. The metal films were measured with a ResiMap CDE, model 168, manufactured by Creative Design Engineering, Inc, 20565 Alves Dr, Cupertino, Calif., 95014. This tool is a four-point probe sheet resistance tool. Twenty-five and forty nine-point polar scans were taken with the respective tools at 3-mm edge exclusion.

Polisher

The polisher that was used is an IPEC-Speedfam Avanti 472, manufactured by SpeedFam IPEC, 305 North 54th Street, Chandler, Ariz., 85226. A Rodel IC-1400-k groove pad, supplied by Rodel, Inc, 3804 East Watkins Street, Phoenix, Ariz., 85034, was used on the primary table with a Suba IV under-liner for the blanket wafer studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton OX-K® colloidal silica, supplied by DuPont Air Products Nanomaterials LLC, at baseline conditions. During polishing, pad conditioning was done with a 4" diamond grit, and effecter at 5 pounds of down force and DI water during the thirty -second buff step of the wafer.

In blanket wafers studies, groupings were made to simulate successive film removal: first tungsten, next titanium, and finally the PETEOS. The tool mid-point conditions were: table speed; 70 rpm, platen speed; 75 rpm, carrier pressure, 7.0 psi; back pressure, 0.0 psi; slurry flow, 175 ml/min.

Wafers

Polishing experiments were conducted using CVD tungsten, titanium, and PETEOS (plasma enhanced tetraethoxysilane) wafers. These blanket wafers were purchased form Silicon Valley Microelectronics, 1150 Campbell Ave California 95126. The film thickness specifications are summarized below:

PETEOS film thickness: 15,000 Å

Titanium film thickness: 3000 Å, film stack as 3000 Å thermal oxide/3000 Å titanium CVD tungsten wafers: 8000 Å, film stack as 6300 Thermal oxide/250 Å titanium/250 Å titanium oxide/8000 Å CVD tungsten.

Zeta Potential Measurements

Zeta potential measurements were made using a Colloidal Dynamics instrument, manufactured by Colloidal Dynamics Corporation, 11-Knight Street, Building E8, Warwick, R.I., 02886. This instrument measures the zeta potential (surface charge) of colloidal particles, such as surface-modified colloidal silica particles.

Surface coverage of aluminum acetate-modified colloidal silica was measured in the following manner. During the preparation of aluminum acetate-modified colloidal silica, aluminum acetate was added to the deionized colloidal silica particles. (The initial colloidal silica used to prepare deionized colloidal silica was Syton® HT-50, which has a negative zeta potential of −75 to −85 mV.) The addition of aluminum acetate changed the zeta potential of the deionized colloidal silica particle surface from a value near zero (−5 mV to +4 mV, depending upon pH) to +32–36 mV. After reaching the full surface coverage, there was observed to be subsequently no further change in the zeta potential of the surface modified colloidal silica. From the plotted titration curve of measured zeta potential as a function of amount of aluminum acetate added to a given amount of silica during surface modification, the percentage of surface coverage of aluminum acetate on the surface of the surface-modified colloidal silica particles was determined to be approximately 99.9%.

Preparation of Aluminum Acetate Surface-Modified Colloidal Silica

The base colloid used in the examples below was aluminum acetate surface-modified colloidal silica. The preparation of this material was done as indicated below.

Aluminum acetate surface-modified colloidal silica was prepared using the following procedure. Deionized water (10,507 grams) and basic aluminum acetate (boric acid stabilized, 1,284 grams, 35.3 weight % alumina equivalent) (Aldrich Chemicals, Milwaukee, Wis.) were combined in a dry mixing vessel (holding approx. 12–15 gallons) that was equipped with high shear agitation means. The mixture was agitated until all solids were completely dissolved affording reaction mixture A.

In a separate clean, dry vessel, deionized water (10,663 grams) and Syton® HT-50 (22,687 grams, approximately 4.31 gallons, DuPont Air Products NanoMaterials LLC, Carlsbad, Calif.) were combined with moderate agitation and mixed thoroughly. With moderate agitation at ambient temperature and with continual pH monitoring, spoonfuls of IRC-120 ion exchange resin (approximately 3,907 grams, (Aldrich Chemicals, Milwaukee, Wis.)) were added to this resulting mixture. After each resin batch addition, the reaction mass pH was allowed to stabilize for several minutes. Additional resin batch additions were made until a pH level of 2.00 +−0.05 was reached. Soon after attaining the target pH of 2, the reaction mixture was filtered to remove the resin beads and affording reaction mixture B.

With high shear agitation and at ambient temperature, reaction mixture B was added to reaction mixture A at a constant rate over a 1 hour period. Once addition was completed, the high shear agitation was continued for 30 minutes affording the aluminum acetate surface-modified colloidal silica.

The pH of aluminum acetate surface-modified colloidal silica was measured to be 4.6 (Table 3) and zeta potential was measured to be +30 to +40 millivolts. From the measured zeta potential, the surface coverage was estimated to be 99.9% using the methodology presented supra.

Example 1

This example illustrates that a CMP slurry (designed for efficient metal removal) comprising silicone resin particles (e.g., Tospearl® 105, Toshiba Silicone Co., Ltd., Tokyo, Japan) affords high selectivity for removal of metal in relation to dielectric material during the course of chemical mechanical planarization.

A 4 kilogram batch of a slurry having the following components was prepared using the procedure below.

Components of Mixture for Preparing 4 Kg of Formulated Slurry
1) Ammonium fluoride (40% solution)=46 grams
2) Periodic acid (30%)=346 grams
3) Aluminum acetate surface-modified colloidal silica (prepared as given supra), 30% solids, positive sol)=154 grams
4) Deionized water=3439 grams
5) 20% Tospearl® 105 dispersion=15 grams Procedure for Mixing the Slurry, 4 Kg Batch Size In a 5-liter beaker, 3439 grams of de-ionized water were transferred and, after adding water to the beaker, it was kept under agitation using a magnetic stirrer. Under agitation, 154 grams of aluminum acetate surface-modified colloidal silica were added slowly during a period of 5 minutes. After the addition of the aluminum acetate surface-modified colloidal silica (sol) was completed, 46 grams of 40% ammonium fluoride were added slowly to the silica sol mixture. Ammonium fluoride was then added slowly (over 30 minutes) to the resulting mixture (added slowly to prevent or minimize gel formation). At this point, the pH was measured, and it fluctuated between 8.2 to 8.7. After completing the addition of ammonium fluoride, 346 grams of 30% periodic acid were added during a period of 40 minutes, during which time the pH dropped to 2.4 to 2.7. After completing the addition of periodic acid, 15 grams of a 20% dispersion in water of silicone resin particles (Tospearl® 105, Toshiba Silicone Co., Ltd., Tokyo, Japan) were next added to the mixture. Stirring was continued for a few minutes to give a uniform dispersion.

This composition was used to effect CMP of a substrate containing areas of tungsten, titanium, and PETEOS. Results obtained are given in Table 1. More specifically, in Table 1, polishing conditions, tungsten removal rates, titanium removal rates, PETEOS removal rates, W;PETEOS selectivity are summarized (as were used or measured in this example).

TABLE 1

Slurry compositions, Effect of Tospearl ® 105 and Surfynol ® 104E Concentrations on Tungsten, Titanium, PETEOS removal rates, and Tungsten:Titanium and Tungsten:PETEOS Selectivities at pH 4

|  | Example 2 (Comparative) | Example 1 | Example 3 | Example 4 | Example 5 | Example 6 |
|---|---|---|---|---|---|---|
| Slurry: | | | | | | |
| pH | 4.0 | 4.0 | 4.0 | 4.0 | 4.0 | 4.0 |
| Modified Silica# (g) | 154 | 154 | 154 | 154 | 154 | 154 |
| Surfynol ® 104E S^ (g) | 0 | 0 | 3449 | 3439 | 3434 | 3444 |
| Ammonium Fluoride (g) | 46 | 46 | 46 | 46 | 46 | 46 |
| Periodic Acid 30% solution (g) | 346 | 346 | 346 | 346 | 346 | 346 |
| 20% Tospearl ® 105* (g) | 0 | 15 | 5 | 15 | 20 | 10 |
| Deionized Water (g) | 3454 | 3439 | 0 | 0 | 0 | 0 |
| Selectivity: | | | | | | |
| W:Ti | 1.83 | 1.82 | 1.7 | 1.83 | 1.85 | 2.02 |
| W:PETEOS | 7.3 | 36.0 | 40 | 47.7 | 53.19 | 49.02 |
| Removal Rates: | | | | | | |
| Tungsten** RR (Å/min) | 3340 | 3123 | 3136 | 3092 | 3234 | 3652 |
| Titanium RR (Å/min) | 1830 | 1715 | 1850 | 1690 | 1750 | 1810 |

TABLE 1-continued

Slurry compositions, Effect of Tospearl ® 105 and Surfynol ® 104E Concentrations on Tungsten, Titanium, PETEOS removal rates, and Tungsten:Titanium and Tungsten:PETEOS Selectivities at pH 4

|  | Example 2 (Comparative) | Example 1 | Example 3 | Example 4 | Example 5 | Example 6 |
|---|---|---|---|---|---|---|
| PETEOS RR (Å/min) | 378 | 86.8 | 78.4 | 64.8 | 60.8 | 74.5 |

Polishing conditions:
BP: Back Pressure = 0 psi
CS: Carrier Speed = 70 rpm
DF: Down force in psi = 7 psi
PS: Platen Speed = 75 rpm
RR: Removal rate, measured in Å of film thickness removed per minute (Å/min)
SF: Slurry Flow Rate (onto platen of polisher) = 175 ml/min
Modified Silica—Aluminum acetate surface-modified colloidal silica
*20% Tospearl ® 105—Polysiloxane resin particles, mean particle size about 0.5 microns, specfic surface area 70 m2 (Toshiba Silicone Co., Ltd., Tokyo, Japan) as a 20 weight percent dispersion in water.
Surfynol ® 104E S—A 0.07 weight % solution in water of Surfynol ® 104E was utilized in these examples.
**CVD tungsten wafers were used for polishing experiments

Example 2 (Comparative)

This example illustrates that a polishing composition similar to that of Example 1 but without the silicone resin component affords much lower selectivity for metal removal in relation to dielectric in CMP.

A 4 kilogram batch of a slurry having the following components was prepared using the procedure below.
Components of Mixture for Preparing 4 Kg of Formulated Slurry
1) Aluminum acetate modified colloidal silica from supra, 30% solids, positive sol)=154 grams
2) Ammonium fluoride (40% solution)=46 grams
3) Periodic acid (30%)=346 grams
4) Deionized water=3454 grams
Procedure for Mixing the Slurry, 4 Kg Batch Size In a 5-liter beaker, 3439 grams of de-ionized water were transferred and, after adding water to the beaker, it was kept under agitation using a magnetic stirrer. Under agitation, 154 grams of aluminum acetate surface-modified colloidal silica were added slowly during a period of 5 minutes. After the addition of the aluminum acetate surface-modified colloidal silica (sol) was completed, 46 grams of 40% ammonium fluoride were added slowly to the silica sol mixture. Ammonium fluoride was then added slowly (over 30 minutes) to the resulting mixture (added slowly to prevent or minimize gel formation). At this point, the pH was measured, and it fluctuated between 8.2 to 8.7. After completing the addition of ammonium fluoride, 346 grams of 30% periodic acid were added during a period of 40 minutes, during which time the pH dropped to 2.4 to 2.7.

This composition was used to effect CMP of a substrate containing areas of tungsten, titanium, and PETEOS. Results obtained are given in Table 1. More specifically, in table 1, polishing conditions, tungsten removal rates, titanium removal rates, PETEOS removal rates, W:PETEOS selectivity are summarized (as were used or measured in this example).

Examples 1 and 2

Comparison

Example 1 illustrates the effect of silicone resin particulate material (e.g., Tospearl® 105) as a component in a slurry composition. This component dramatically increases the selectivity for tungsten removal in relation to PETEOS as shown in the tables. The W:PETEOS selectivity for a slurry with this additive was 36.0 (Example 1, Table 1) versus a W:PETEOS selectivity of only 7.3 for a comparable base slurry without this additive (Example 2 (Comparative) in Table 1).

Example 3

This example illustrates the synergistic relationship of a silicone resin and an acetylenic alcohol as components in a slurry with respect to selectivity for metal removal versus dielectric material when the slurry is used in CMP.

A 4 kilogram batch of a slurry having the following components was prepared using the procedure below.
Components of Mixture for Preparing 4 Kg of Formulated Slurry
1) Ammonium fluoride (40% solution)=46 grams
2) Aluminum acetate surface-modified colloidal silica (preparation given supra), 30% solids, positive sol)=154 grams
3) Surfynol 104E® 0.07% solution=3,449 grams
4) Periodic acid (30%)=346 grams
5) 20% Tospearl® 105 dispersion 5 grams
Procedure for Mixing the Slurry, 4 Kg Batch Size In a 5-liter beaker, 3449 grams of 0.07% Surfynol® 104E water solution (S-H2O) was transferred. After adding S-H2O to the beaker, the contents of the mixture were stirred using a magnetic stirrer. Under agitation, 154 grams of aluminum acetate surface- modified colloidal silica (preparation given supra) was added slowly during a period of 5 minutes. After the addition of aluminum acetate surface-modified colloidal silica (sol) was completed, 46 grams of 40% ammonium fluoride were added slowly to the silica sol mixture. Ammonium fluoride was then added slowly (over 30 minutes) to the resulting mixture (added slowly to prevent or minimize gel formation). At this point, the pH was measured, and it fluctuated between 8.2 to 8.7. After completing the addition of ammonium fluoride, 346 grams of 30% periodic acid were added during a period of 40 minutes, during which time the pH dropped to 2.4 to 2.7. After completing the addition of periodic acid, 5 grams of 20% silicone resin particles (Tospearl® 105, Toshiba Silicone Co., Ltd., Tokyo, Japan) were added. The resulting dispersion was agitated for an additional 5 minutes.

This composition was used to effect CMP of a substrate containing areas of tungsten, titanium, and PETEOS. Results obtained are given in Table 1. More specifically, in Table 1, polishing conditions, tungsten removal rates, titanium removal rates, PETEOS removal rates, W:PETEOS selectivity are summarized (as were used or measured in this example).

A synergistic effect between the silicone resin and acetylenic alcohol components was established as shown by the results tabulated in the tables. Specifically, the slurry of Example 3 containing both of these components exhibited a higher W:PETEOS selectivity (40) than did the slurries of Example 1 (W:PETEOS selectivity=36 with only silicone resin component) and Example 9 (W:PETEOS selectivity=28.9 with only acetylenic alcohol component).

Examples 4 through 6

In Examples 4 through 6, the amount of Tospearl® 105 in the polishing compositions was varied from 15 grams to 20 grams and then to 10 grams, respectively. These compositions were otherwise basically identical to that of Example 1 (with the exception of slight changes in the amount of Surfynol® 104E as shown in Table 1). All other components were substantially the same. Table 1 includes polishing data at pH=4 for these compositions.

Examples 4 and 5 illustrate that increasing the level of silicone resin component results in higher W:PETEOS selectivity (i.e., 47.7 and 53.19, respectively, versus 40 for Example 3).

Examples 7 and 8

In Table 2, the effect of pH on the selectivity of tungsten to PETEOS was studied; which is shown in Examples 7 and 8. The composition was basically the same as for Example 4 (except for slightly different amounts of Surfynol® 104E S) and except for the indicated difference in pH, which was controlled by adding sodium hydroxide. Clearly, tungsten removal rates were substantially higher at pH=2.6 versus pH=4.5 (4,078 Å/min versus 3,670 Å/min as shown in Table 2). Thus, by lowering the pH, the tungsten removal rate can be enhanced further.

TABLE 2

Slurry compositions, Effect of Tospearl ® and Surfynol ® 104E concentrations on Tungsten, Titanium, PETEOS removal rates, and Tungsten:Titanium and Tungsten:PETEOS Selectivities at pH 2.6, and 4.5

|  | Example 7 | Example 8 |
| --- | --- | --- |
| Slurry: |  |  |
| pH | 2.6 | 4.5 |
| Modified Silica# (g) | 154 | 154 |
| Surfynol ® 104E S^ (g) | 3254 | 3254 |
| Ammonium Fluoride (g) | 46 | 46 |
| 30% periodic acid (g) | 346 | 346 |
| 20% Tospearl ® 105* (g) | 15 | 15 |
| Deionized Water (g) | 0 | 0 |
| Selectivity: |  |  |
| W:Ti | 2.1 | 1.9 |
| W:PETEOS | 39.9 | 33.98 |
| Removal Rates: |  |  |
| Tungsten** RR (Å/min) | 4078 | 3670 |
| Ti RR (Å/min) | 1870 | 1890 |
| PETEOS RR (Å/min) | 102 | 108 |

Polishing conditions:
BP: Back Pressure = 0 psi
CS: Carrier Speed = 70 rpm
DF: Downforce in psi = 7 psi
PS: Platen Speed = 75 rpm
RR: Removal rate, measured in Å of film thickness removed per minute (Å/min)
SF: Slurry Flow Rate (onto platen of polisher) = 175 ml/min
Modified Silica—Aluminum acetate surface-modified colloidal silica
*20% Tospearl ® 105—Polysiloxane resin particles, mean particle size about 0.5 microns, specfic surface area 70 m2 (Toshiba Silicone Co., Ltd., Tokyo, Japan) as a 20 weight percent dispersion in water.
^Surfynol ® 104E S—A 0.07 weight % solution in water of Surfynol ® 104E was utilized in these examples.
**CVD tungsten wafers were used for polishing experiments Example 9

This example illustrates the effect of Surfynol® 104E as a component in a slurry composition. This component dramatically increases the selectivity for tungsten removal in relation to PETEOS as shown in the tables. The W:PETEOS selectivity for a slurry with this additive was 28.9 (Example 9, Table 3) versus a W:PETEOS selectivity of only 7.3 for a comparable base slurry without this additive (Example 2 (Comparative) in Table 1).

TABLE 3

Slurry Compostions, Effect of Surfynol ® 104E on Tungsten, Titanium, PETEOS removal rates, and its role on W:PETEOS, and W:Ti selectivities.

|  | Aluminum acetate modified colloidal silica | Example 9 | Example 10 |
| --- | --- | --- | --- |
| Slurry: |  |  |  |
| pH | 4.6 | 2.5 | 4.34 |
| Modified Silica# (g) | 30% silica sol that has been surface-modified | 154 | 628 |
| Surfynol ® 104E S^ (g) | 0 | 3464 | 0 |
| Ammonium Fluoride (g) | 0 | 46 | 46 |
| Periodic Acid, 30% (g) | 0 | 346 | 292 |
| 20% Tospearl ® 105 (g) | 0 | 0 | 0 |
| Water (g) |  | 3454 | 3032 |
| Selectivity: |  |  |  |
| W:Ti |  | 3.3 | 3.54 |
| W:PETEOS |  | 28.9 | 8.33 |

TABLE 3-continued

Slurry Compostions, Effect of Surfynol ® 104E on Tungsten, Titanium, PETEOS removal rates, and its role on W:PETEOS, and W:Ti selectivities.

|  | Aluminum acetate modified colloidal silica | Example 9 | Example 10 |
|---|---|---|---|
| Removal Rates: |  |  |  |
| Tungsten** RR (Å/min) |  | 5735 | 5200 |
| Titanium RR (Å/min) |  | 1710 | 1496 |
| PETEOS RR (Å/min) |  | 198 | 635 |

CS: Carrier Speed = 70 rpm
DF: Downforce in psi = 7 psi
BP: Back Pressure = 0 psi
PS: Platen Speed = 75 rpm
SF: Slurry Flow Rate = 175 ml/min
**For polishing, ion sputtered tungsten films were used.
Modified Silica—Aluminum acetate surface-modified colloidal silica
^Surfynol ® 104E S—A 0.07 weight % solution in water of Surfynol ® 104E was utilized in Example 9.

Example 10 (Comparative)

This comparative example illustrates that substantially increasing the amount of aluminum acetate surface-modified colloidal silica abrasive in a polishing composition that lacks either Surfynol® 104E or Tospearl® 105 does not significantly increase the tungsten:PETEOS selectivity as seen in Table 3. In Example 2 (comparative), the surface-modified silica level was 154 grams and this composition afforded a W:PETEOS selectivity of 7.3 (see Table 1). In this Example 10 (comparative), the surface-modified silica level was 628 grams and this composition afforded a W:PETEOS selectivity of 8.3 (see Table 3).

Examples 9 and 10

These examples illustrates the effect of Surfynol® 104E at various levels when used as a component in a slurry composition. Over the range of 0–0.05 weight percent of this component, there is an approximate linear relationship between W:PETEOS selectivity versus weight percent of this component. In sharp contrast, there is a leveling off in selectivity at about 0.07 weight percent.

As summarized in Table 3, in this example a polishing composition was tested that had a Surfynol® 104E level of 0% weight percent as shown for Example 10. The measured W:PETEOS selectivity was 8.33% whereas W:PETEOS selectivity was 28.9% at the Surfynol 104E concentration level of 0.07 weight % as shown for Example 9 in Table 3.

Example 11

Part 1 (Comparative)

In this example, a composition was prepared for testing in metal CMP that was the same as that of Example 9 except that an equimolar amount of Surfynol® 465 was used in place of the 0.07% level of Surfynol® 104E. Surfynol® 465 differs fundamentally from Surfynol® 104E in that the former is an ethoxylated compound while the latter has two free hydroxyl groups (as indicated by the chemical name for Surfynol® 104E as given in the Glossary and tables). When this composition containing Surfynol® 465 was made up, the Surfynol® 465 was observed to be essentially immiscible in the aqueous—based slurry and consequently the slurry phase separated and settled significantly within a short time before CMP testing could be done.

Example 11

Part 2 (Prophetic)

Had the slurry described above in Example 11—Part 1 not settled, it would have been tested in metal CMP processing in the same manner as was done in Example 9, and the measured W:PETEOS selectivity would be projected to be much lower than the very high value (28.9) measured in Example 11 for the related composition containing Surfynol® 104E.

Summary of Examples

Overall, the above examples, specifically Examples 1, 2, 4, and 9 shown in Tables 1,2, and 3, illustrate that there is a synergistic effect between the acetylenic alcohol and silicone resin components in these polishing compositions with respect to achieving both high selectivity and high metal removal rates. Increasing the Surfynol® 104E level above about 0.04 weight percent leads to a decreasing tungsten removal rate. As illustrated in some of the examples, one can hold the Surfynol® 104E level at a point (e.g., 0.07 weight %) where the metal removal rate is still high, and then add increasing amounts of silicone resin (e.g., Tospearl®) to achieve even higher selectivities while maintaining also high metal removal rates. Hence there is a beneficial synergistic effect between these components.

The present invention has been set forth with regard to several preferred embodiments, however, the full scope of the present invention should be ascertained from the several claims set forth below.

What is claimed is:

1. A polishing composition comprising:
   a) an abrasive;
   b) a hybrid organic/inorganic particle dispersed in an aqueous medium, wherein the hybrid organic/inorganic particle is physically independent of the abrasive; and
   c) an alkyne compound having at least one hydroxyl substituent.

2. The composition of claim 1 wherein the hybrid organic/inorganic particle has an average diameter from 0.2 microns to 1.5 microns.

3. The composition of claim 1 wherein the hybrid organic/inorganic particle is a silicone particle.

4. The composition of claim 3 wherein the silicone particle comprising a three-dimensional polymer chain of the formula:

$$R_xSiO_{2-(x/2)}$$

in which x is a positive number greater than or equal to 1 and R is an organic group.

5. The composition of claim 4 wherein x in the formula is a positive number in the range from 1 to 1.9.

6. The composition of claim 4 wherein R in the formula is a hydrocarbon group having one to eight carbon atoms.

7. The composition of claim 3 wherein the silicone particle is a polysilsesquioxane having an oxygen to silicon ratio of about 1.5.

8. The composition of claim 1 further comprising an oxidizing agent.

9. The composition of claim 8 wherein the oxidizing agent is selected from the group consisting of hydrogen peroxide, periodic acid, and alkali metal periodate.

10. The composition of claim 1 wherein the abrasive comprises silica.

11. The composition of claim 1 wherein the alkyne compound has at least two hydroxyl substituents.

12. The composition of claim 1 wherein the alkyne compound is a $C_4$–$C_{22}$ alkyne.

13. The composition of claim 12 wherein the alkyne compound is a $C_{12}$–$C_{16}$ alkyne.

14. The composition of claim 13 wherein the alkyne compound is 2,4,7,9-tetramethyl-5-decyn4,7diol.

15. A polishing composition comprising:
 a) an abrasive;
 b) a hybrid organic/inorganic particle dispersed in an aqueous medium, wherein the hybrid organic/inorganic particle is neither covalently bonded to nor coated on the abrasive; and
 c) an alkyne compound having at least one hydroxyl substituent.

16. A method of chemical mechanical planarization of a substrate comprised of a metal and dielectric material comprising polishing said substrate with the composition according to claim 1 or claim 15.

* * * * *